United States Patent [19]

Tachibana et al.

[11] Patent Number: 4,653,030

[45] Date of Patent: Mar. 24, 1987

[54] SELF REFRESH CIRCUITRY FOR DYNAMIC MEMORY

[75] Inventors: Tadashi Tachibana, Miho, Japan; Chitranjan N. Reddy, Sugarland; Ngai H. Hong, Houston, both of Tex.

[73] Assignee: Texas Instruments Incorporated, Dallas, Tex.

[21] Appl. No.: 646,655

[22] Filed: Aug. 31, 1984

[51] Int. Cl.$^4$ .............................................. G11C 7/00
[52] U.S. Cl. .................................... 365/222; 307/475
[58] Field of Search .................. 365/189, 230, 222; 377/68; 307/475

[56] References Cited

U.S. PATENT DOCUMENTS

| | | | |
|---|---|---|---|
| 4,110,639 | 8/1978 | Redwine | 365/230 |
| 4,239,993 | 12/1980 | McAlexander III et al. | 365/205 |
| 4,342,103 | 7/1982 | Higuchi et al. | 365/230 |

*Primary Examiner*—James W. Moffitt
*Attorney, Agent, or Firm*—John G. Graham

[57] ABSTRACT

A semiconductor dynamic read/write memory of the multiplexed-address type employs an on-chip refresh counter which is activated by $\overline{CAS}$-before-$\overline{RAS}$ sequence. This counter is made up of stages almost identical to the row address buffers so the same clocks can be used. Either the address input buffers or the refresh counter stages are gated into second-stage row address buffers, and carry feedback from these second stage buffers to the counter stages is used to increment the counter. The access time of the memory for normal read or write is not degraded by the refresh circuitry.

14 Claims, 6 Drawing Figures

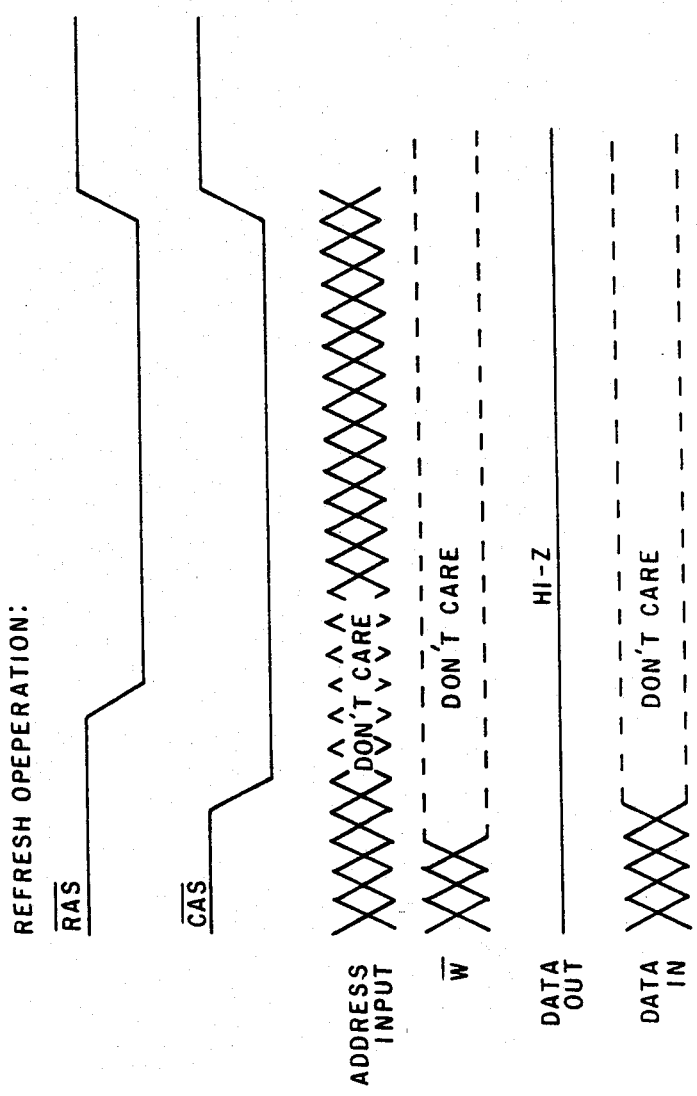

SELF REFRESH CIRCUITRY FOR DYNAMIC MEMORY

BACKGROUND OF THE INVENTION

This invention relates to semiconductor devices, and more particularly to self refresh circuitry of the type used in semiconductor dynamic memory devices.

Dynamic read/write memory devices are constructed as illustrated, for example, in U.S. Pat. No. 4,071,801, issued to White, McAdams and Redwine (a 16K DRAM) or U.S. Pat. No. 4,293,993, issued to McAlexander, White and Rao (a 64K DRAM), both assigned to Texas Instruments. These dynamic RAMs must be periodically refreshed because data is stored in capacitors and is subject to leakage. Self refresh arrangements for DRAMs are shown in U.S. Pat. No. 4,207,614, issued to Lionel S. White and G. R. Mohan Rao, U.S. Pat. No. 4,336,647 issued to David J. McElroy, both assigned to Texas Instruments, and in pending application Ser. No. 401,688 filed July 26, 1982, now U.S. Pat. No. 4,494,222.

In prior self-refresh methods for DRAMs, degradation of the access speed for normal read and write cycles may be caused by the addition of the circuitry needed to implement the refresh functions. Or, the refresh counter may have employed additional clocks or other circuitry not compatable with the normal functions. Self-refresh is an option which is often left unused, especially in large memory systems, so the refresh counter should be of relatively simple construction and not add to complexity of the manufacturing process or bar layout.

It is the principle object of this invention to provide improved high-speed self-refresh circuits for semiconductor integrated circuits such as dynamic memory devices. Another object is to provide improved compatability between operation of refresh counter circuitry and normal read/write access in a dynamic RAM, as well as simplified construction.

SUMMARY OF THE INVENTION

In accordance with one embodiment of the invention, a a semiconductor dynamic read/write memory of the multiplexed-address type employs an on-chip refresh counter which is activated by $\overline{CAS}$-before-$\overline{RAS}$ sequence. This counter is made up of stages almost identical to the row address buffers so the same clocks can be used. Either the address input buffers or the refresh counter stages are gated into second-stage row address buffers, and carry feedback from these second stage buffers to the counter stages is used to increment the counter. The access time of the memory for normal read or write is not degraded by the refresh circuitry.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, when read in conjunction with the accompanying drawings, wherein:

FIGS. 2a–2h are a timing diagrams showing voltage vs. time in the operation of the device of FIG. 1;

DETAILED DESCRIPTION OF SPECIFIC EMBODIMENT

Figure 1:
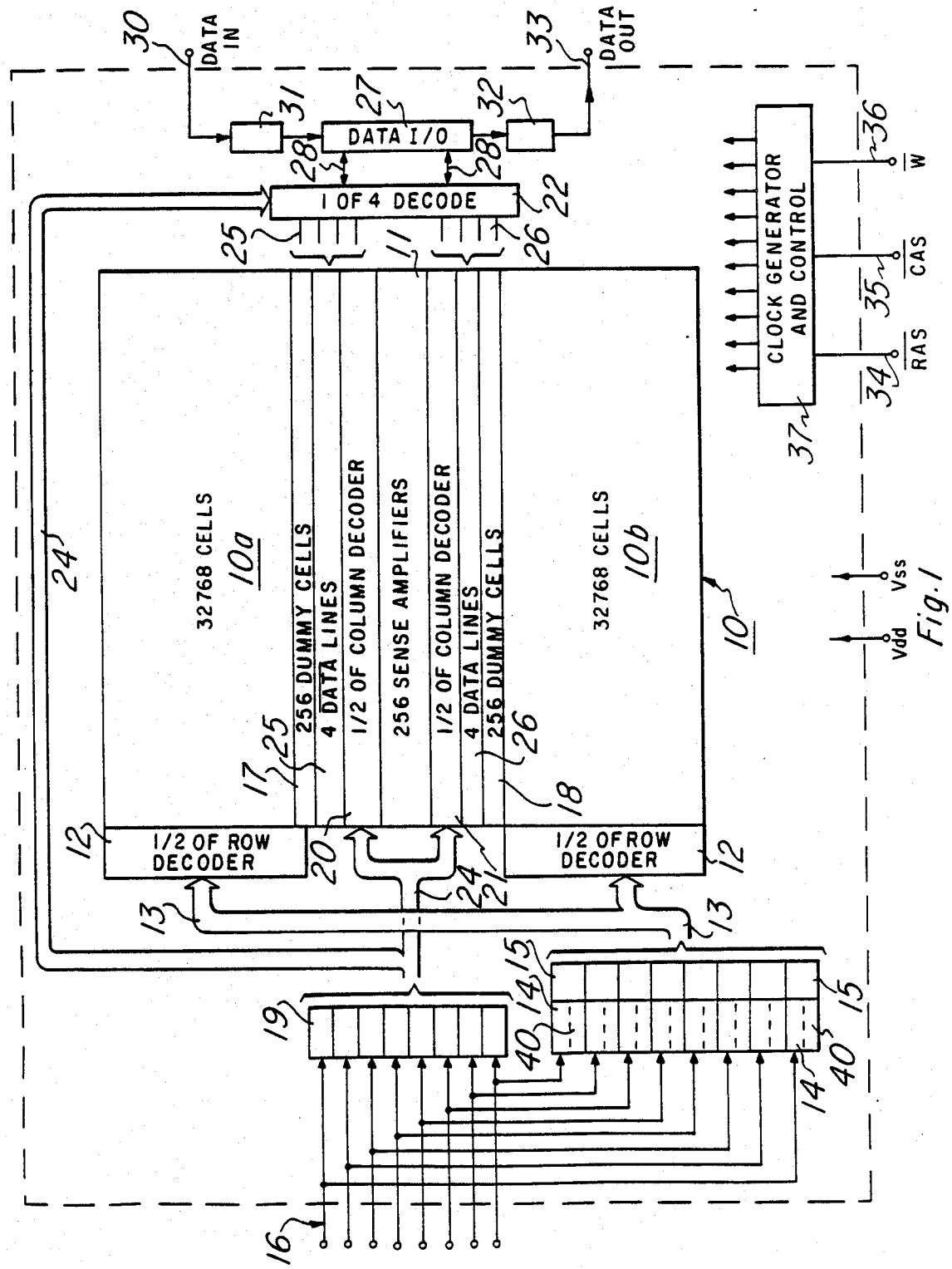
FIG. 1 is an electrical diagram in block form of a semiconductor dynamic memory device which may use the self-refresh method of the invention.

Referring to FIG. 1, a memory device which may utilize the refresh technique of this invention is illustrated in block diagram form. This is a semiconductor read/write memory of the dynamic type, typically made by an N-channel, self-aligned, silicon gate, MOS process, although it could as well be CMOS, metal gate, etc. All of the memory device of FIG. 1 is included in one silicon chip probably less than about 30,000 square mils in size, which usually would be mounted in a standard dual-in-line package having sixteen or eighteen pins or terminals, depending upon type and design. A $64K \times 1$ version of this type of device (without the refresh counter of the invention) is now commercially available under the part number TMS4164, and a $16K \times 4$ version under part number TMS4416. Of course, the features of the invention may be used in 256K or 1-Megabit dynamic RAMs, for example. In the example of FIG. 1, however, the device includes an array 10 of 65,536 memory cells, with the array split into two halves 10a and 10b of 32,768 cells each, in a regular pattern of 256 rows and 256 columns. Of the 256 row or X lines, there are 128 in the array half 10a and 128 in the half 10b. The 256 column lines are each split in half (providing two bit lines per column) with one bit line of each column line being in each of the array halves 10a and 10b; of course, folded bit lines, the electrical equivalent, may be employed. There are 256 sense amplifiers 11 in the center of the array; these are differential type bistable circuits made such as that disclosed and claimed in the above-mentioned U.S. Pat. No. 4,239,993, incorporated herein by reference. Each sense amplifier is connected in the center of a column line, so 128 memory cells are connected to each side of each sense amplifier by a bit line (or column line half). The chip requires only a single +5 V Vdd supply, along with a ground terminal Vss.

A row or X address decoder 12, split into two halves, receives sixteen A and $\overline{A}$ signals by lines 13 from eight address input buffers or latches 14 by eight two-stage address output buffers 15. As will be explained, a refresh address can be inserted at the inputs to buffers 15 from counter stages corresponding to the buffers 14. An eight-bit X address at TTL voltage levels is applied to inputs of the address buffers 14 by eight address input terminals 16. The X decoder 12 functions to select one of the 256 row lines as defined by an eight bit address on the input terminals 16 or by an internally-provided refresh address from the counter stages. If the selected row line is in the half 10b of the cell array then a row of dummy cells 17 on the opposite side of the sense amplifiers 11 is also activated, while if a line in the half 10a is selected then a row of a dummy cells 18 is activated. The address signals on the input lines 16 are multiplexed; the Y or column address is also applied to these input lines and is latched into a set of eight buffers 19, from which the address is applied to column decoders 20, 21 and 1-of-4 selector 22 via lines 24. A one-of 64 (actually 4-of-256) selection is made by the column decoders 20 and 21, so that one group of four columns is connected to sets of four data and data bar lines 25 and 26, based on six bits of the eight bit Y address. The one-of-four decoder 22 selects one pair of the four pairs of lines 25 and 26, based on the two address bits and complements on lines 24 from the eight bit column aaddress, and connects the selected pair to data input-/output circuitry 27 via a pair of lines 28. A single-bit data input is applied by an input terminal 30 to a data input latch 31, and the output of this latch is coupled by the data I/O circuitry 27 to the 1-of-4 decoder 22, and thus to the selected column of the array 10. This latch 31 may be of the same circuit design as the address buffer circuits 14 and 15, which is a circuit as shown in U.S. Pat. No. 4,280,070.

Figure 2A:
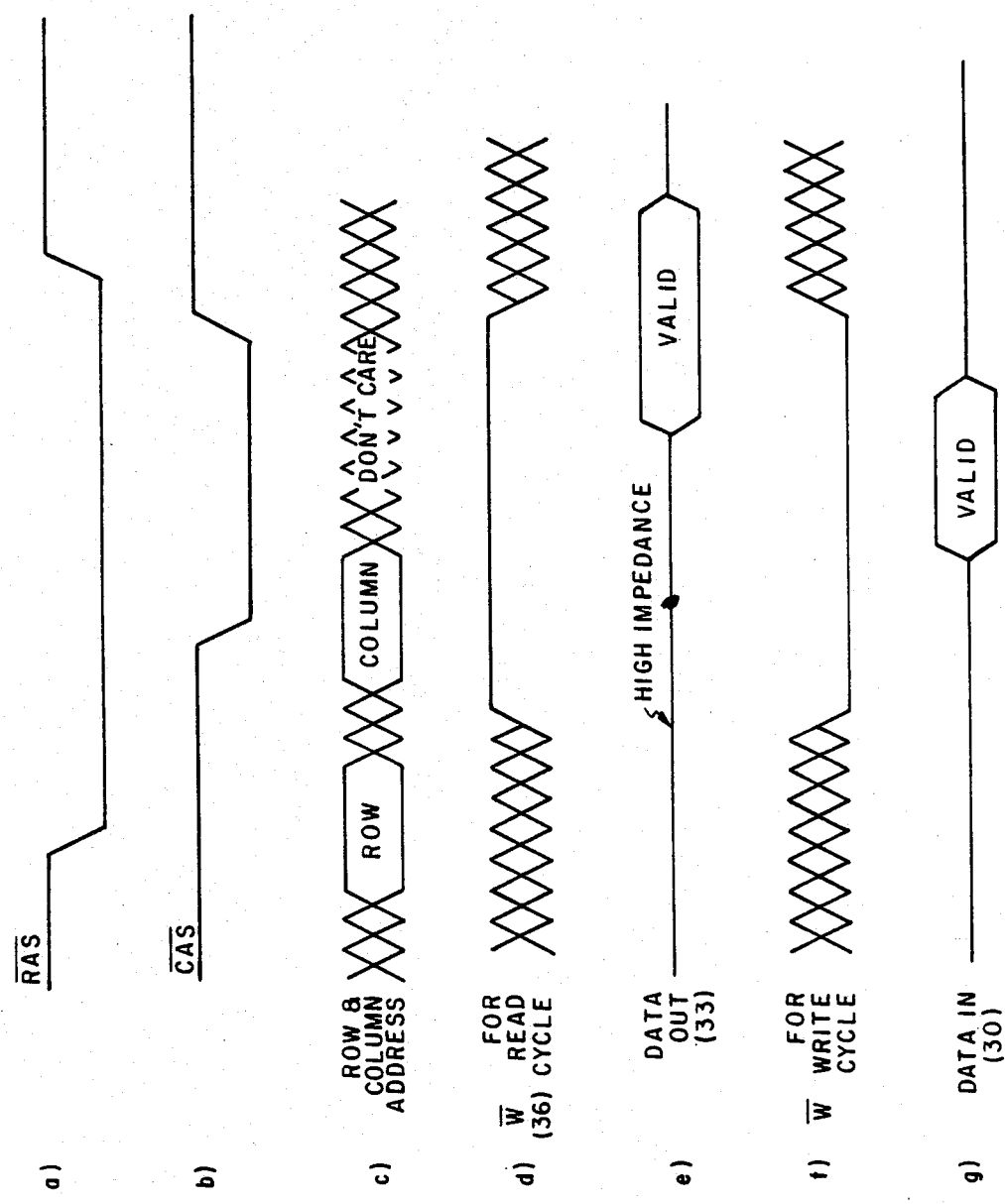

As seen in FIG. 2, for standard access (rather than refresh) the X address must appear on the inputs 16 when a row address strobe signal $\overline{RAS}$ is applied to an input 34. Likewise, the Y address must appear during a column address strobe signal $\overline{CAS}$ on an input 35. A read/write control $\overline{W}$ on an input 36 is the other control signal for this device. These three inputs are the controls and also the basic timing clocks of the system, and are applied to clock generator and control circuitry 37 which generates a large number of clocks and control signals as discussed below and in U.S. Pat. No. 4,239,993 to define the operation of various parts of the device. In a standard access cycle when $\overline{RAS}$ goes low as seen in FIG. 2a, clocks derived from $\overline{RAS}$ cause the buffers 14 to accept and latch the eight TTL level bits then appearing on the input lines 16. When $\overline{CAS}$ goes low as seen in FIG. 2b then clocks generated in the circuitry 37 cause the buffers 19 to latch the TTL level Y address signals on the inputs 16. The row and column addresses must be valid during the time periods shown in FIG. 2c. For a read cycle, the $\overline{W}$ signal on input 36 must be high during the period seen in FIG. 2d, and the output on the terminal 33 will be valid during the time seen in FIG. 2e. For a write-only cycle, the $\overline{W}$ signal must be low as seen in FIG. 2f and the data-in bit must be valid during the time seen in FIG. 2g. The data-out pin stays in a high impedance state during a write-only cycle. A read/write or read-modify-write cycle is also possible in which the $\overline{W}$ control drops while $\overline{RAS}$ and $\overline{CAS}$ are still down.

According to the invention, a refresh cycle is provided in which a refresh operation is initiated by $\overline{CAS}$ dropping before $\overline{RAS}$ as seen in FIG. 2h. Here the address on pins 16 is ignored, i.e., "don't care". Also, the data input pin 30 is ignored, and the data output pin stays in the high impendance state. A set of eight refresh counter stages 40 are provided alongside the input buffer stages 14 for the row address. Only a row address is used for refresh; the column address is not needed. The sense amplifiers 11 operate in the usual manner as described in U.S. Pat. No. 4,239,933, but the column buffers 19, the column decoders 20,21,22 and the output circuit 27, do not function in a refresh-only cycle.

If the maximum refresh period is 4 ms, as is specified for the aforementioned TMS4164, and 256 rows are to be refreshed, then the $\overline{CAS}$-before-$\overline{RAS}$ sequence should be applied on average every (4 ms)/256=15.6 microsec. This is controlled by the processor or memory controller, external to the memory device of FIG. 1.

Figure 3:
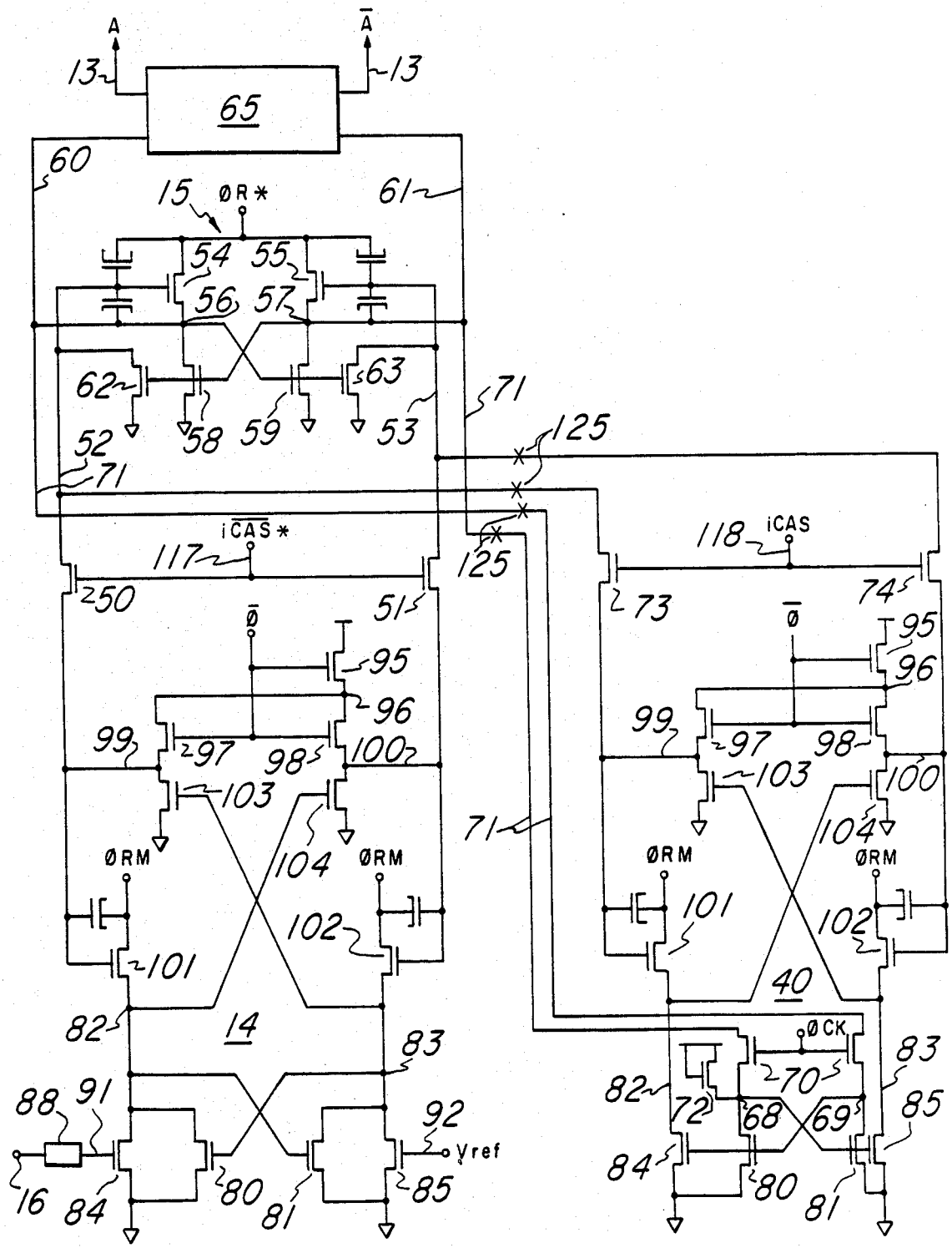
FIG. 3 is an electrical schematic diagram of an input buffer and refresh address counter circuit according to the invention.
Figure 4:
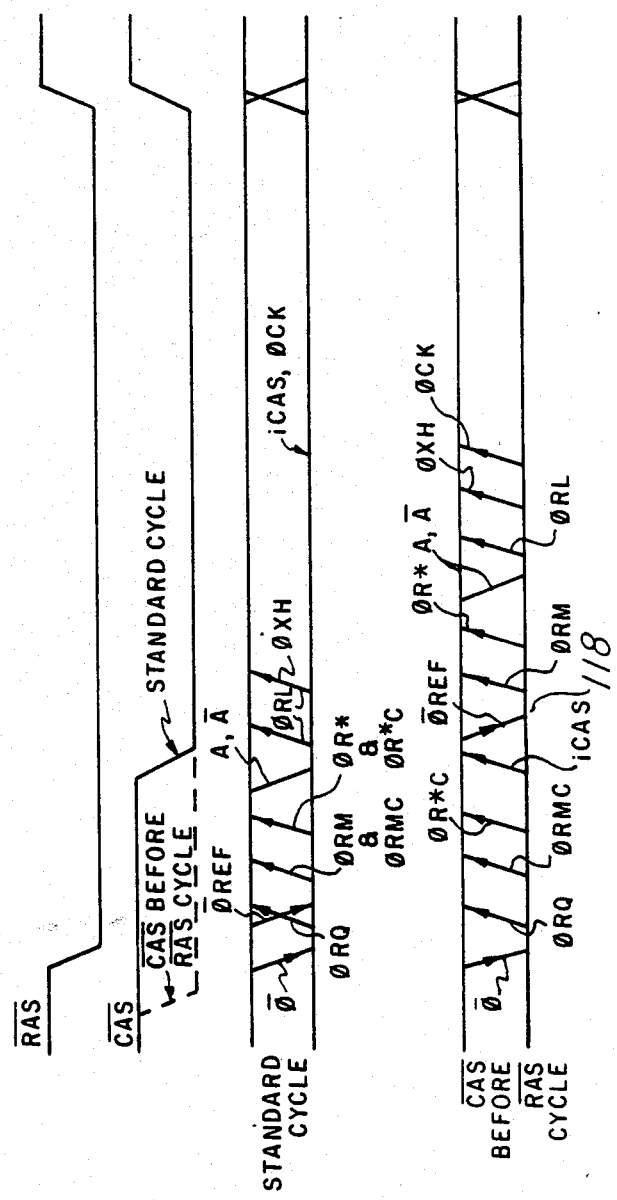
FIG. 4 is a timing diagram showing voltage as a function of time for various clocks in the circuit of FIG. 3.

Referring to FIG. 3, one of the eight sets of circuitry for a row address buffer 14, a two-stage address output buffer circuit 15 and a counter stage 40 is shown in detail. The row address buffer circuit 14 is a differential detector as set forth in FIG. 5 of U.S. Pat. No. 4,280,070, issued to White, McAlexander, et al, assigned to Texas Instruments. This circuit consists of a balanced flip-flop including a pair of driver transistors 80 and 81 having drains at nodes 82 and 83 cross-coupled to the opposite gates to provide bistable operation. Input transistors 84 and 85 are connected in parallel with the driver transistors. A dc reference voltage Vref of about 1.5 v is connected to the gate of the transistor 85. The address input bit to be detected, amplified and latched upon is applied via an input terminal 16 through a suitable input protection 88 to the gate of the transistor 84. The reference voltage is selected to be half way between the worst case TTL low level of 0.8 v and the worst case TTL low level of 2.4 v. The input signal and the reference voltage are latched onto nodes 91 and 92 when a $\overline{RAS}$ related clock such as $\phi$ goes to Vss. The next stage of the buffer 14 functions to sense the change in voltage on the nodes 82 and 83 when the flip-flop operates. In this next stage, a transistor 95 is connected between Vdd and a node 96, which in turn is connected through the source-to-drain paths of a pair of transistors 97 and 98 to nodes 99 and 100. The gate of all three of these transistors 95, 97 and 98 are connected to a $\phi$ clock as seen in FIG. 4. Thus, during the precharge part of the cycle, when $\phi$ is high, the internal nodes are precharged; the transistors 95, 97 and 98 are on, which equalizes the voltages on the nodes 99 and 100 and precharges these nodes to a level of Vdd-Vt. At the time $\phi$ is high and the nodes 99 and 100 are high, $\phi$RM seen in FIG. 4 is at a low level near or equal to Vss. Transistors 101 and 102, connected between the $\phi$RM clock and nodes 82 and 83, are on when $\phi$RM is low, predischarging the nodes 82 and 83 to a low level or Vss. This holds a pair of transistors 103 and 104 off. No dc current flows in the buffer circuit at this point.

The 1.5 V reference voltage is applied to the node 92 when the input clock $\phi$ is high, while the TTL signal input level is applied to the node 91. When the input clock goes low the TTL level is trapped on the node 91 and Vref level on the node 92. As $\phi$RM goes high, transistors 101 and 102 can begin to be conductive; if the voltage on one or both of the nodes 91 and 92 is about Vt for 84 or 85, the transistors 84 and/or 85 can be conductive. More current will flow through the transistor with the highest gate voltage. The voltage on both nodes 82 and 83 will start to rise with $\phi$RM. If a TTL "1" level is applied to the input 16 and latched on the node 91, then the transistor 84 will conduct more at this point than transistor 85.

The node 82 will be pulled to Vss, turning off transistor 81 and allowing the node 83 to continue to rise, latching the flip-flop. The transistor 104 will be off and the transistor 103 on, leaving node 100 at its precharged high level of Vdd-Vt, and node 99 will be discharged to Vss. The nodes 99 and 100 are the outputs of the first stage of the input buffer 14. The current drive capability of the transistors 101 and 102 is limited, so typically two more buffer stages, represented by the output stages 15, are used to drive the address decoders with A and $\overline{A}$ on lines 13, for example.

Operation for a "0" level TTL input is similar but the flip-flop latches in the opposite state. The node 92 will be higher than the node 91 and the transistor 85 will pull the node 83 to Vss, turning off transistor 80. This allows the node 82 to continue to rise with φRM. The transistor 104 will turn on, discharging the node 100 while transistor 103 will be off allowing the node 99 to stay high.

The second stage 15 receives the first stage output from nodes 99 and 100 through first transfer means comprising transistors 50 and 51 having the control signal iCAS* on their gates. The input nodes 52 and 53 of the second stage are coupled to the gates of transistors 54 and 55, whih function to connect the clock φR* (see FIG. 4) to the nodes 56 and 57 of the cross-coupled latch made up of transistors 58 and 59. Thus, when φR* goes high, while iCAS* remains high, the input address bit causes one of the transistors 54 or 55 to be conductive so that one of the nodes 56 or 57 goes high, the other low. This sets the flip-flop made up of transistors 58 and 59, and outputs 60 and 61 to the third stage are likewise driven to 1 and 0 levels. Transistors 62 and 63 reinforce the levels on nodes 52 and 53 as their gates are connected to nodes 56 and 57. The third stage 65 is another bistable, differential detector and functions to increase the output drive level of the A and $\overline{A}$ signals on lines 13.

The counter stage 40 is a circuit very similar to the input buffer 14; the transistors 95–98 and 101–104 have the same function as in stage 14, and the clocks $\overline{\phi}$ and φRM function the same. However, the inputs to the transistors 84 and 85 are from an increment arrangement employing a flip-flop made up of the driver transistors 80 and 81 with sense nodes 68 and 69 connected through third transfer means comprising transistors 70 and lines 71 to nodes 56 and 57 of the second stage 15. Note that the lines 71 connecting the nodes 56 and 57 to nodes 68 and 69 criss-cross so if the clock φck goes high (this is determined by the carry arrangement) then the complement of the bit in the second-stage latch 15 is entered into the nodes 68,69. A high resistance transistor 72 forces this latch to a zero stage at power-on. Thus, the refresh address counter is made up of eight of these latches 40 which are coupled into the second stages 15 of the input buffers when second transfer means comprising transistors 73 and 74 are rendered conductive by an iCAS clock; the counter starts at zero and each stage is selectively incremented through the path including transistors and lines 70,71 every time a $\overline{CAS}$-before-$\overline{RAS}$ occurs.

Figure 5:
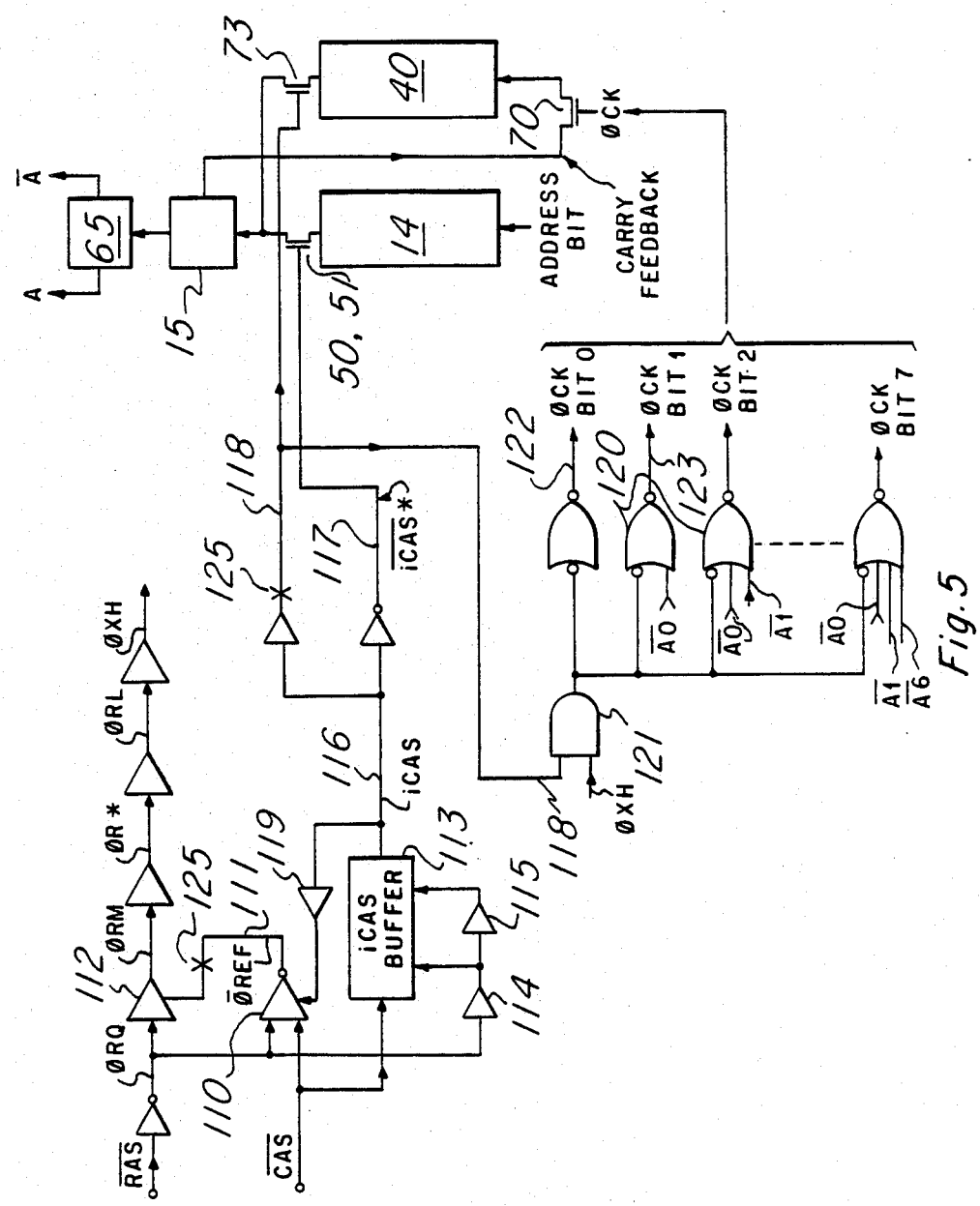
FIG. 5 is a logic diagram of clock generator circuitry used in the device of FIGS. 1 and 3, producing the clocks of FIG. 4.

The part of the clock generator circuitry 37 which is related to the refresh operation is shown in FIG. 5. For an ordinary access cycle, $\overline{RAS}$ drops before $\overline{CAS}$ as seen in FIG. 4, and φRQ is applied to the input of gate 110 while $\overline{CAS}$ is high so φREF on line 111 drops, allowing gate 112 to produce φRM immediately, thus setting the flip-flops 103,104 of the eight input buffers 14. The clock φRM also produces the clock φR*, setting the second stage 15 as described above (if iCAS is high), and φRL and φXH follow; these clocks are used in the row decoder, row line drivers, etc. Subsequently, of course, the sense clocks would be generated to operate the sense amplifiers as set forth in U.S. Pat. No. 4,239,993.

The selection between using the input buffer 14 or the refresh counter 40 as the source of the row address is made by the output of the iCAS clock generator 113 of FIG. 5. This output iCAS is low and stays low if $\overline{CAS}$ drops after $\overline{RAS}$. When $\overline{CAS}$ drops, if $\overline{RAS}$ has dropped producing φRQ, and thus φRMC and φR*C will have occurred at the outputs of stages 114 and 115, then the iCAS signal stays low at output 116 (meaning that an access rather than a refresh is in progress), and this produces iCAS* on line 117. The iCAS signal on line 118 is low. If iCAS goes high at 116 (meaning that a refresh is requested), then iCAS* goes low, blocking transistors 73 and 74, and allows the refresh count to be used instead of the input address. After a delay in stage 119, iCAS going high also allows the output φREF from gate 110 to drop (at time 118 of FIG. 4), so the clocks φRM, φR*, etc. will follow in a delayed sequence as the stage 112 is unblocked.

The increment function is implemented by the NOR gates 120 of FIG. 5. When iCAS goes high an output from AND gate 121 goes high when φXH goes high, allowing the NOR gates 120 to be controlled by the address bits A, $\overline{A}$ as indicated. The The φCK output 122 to the LSB of the counter goes high every refresh cycle. The φCK output 123 to the next-to-LSB goes high only if the LSB refresh address bit is a 1. The φCK clock for the third bit goes high if the first and second are 1's, etc., implementing a binary count.

It is important to note that in a standard cycle, FIG. 4, there is no delay introduced in the clock timing chain; the delay to allow the refresh count to be inserted only occurs for a refresh cycle. The access time for the memory is thus not degraded.

The circuitry of FIGS. 3 and 5 is easily programmable at the metal mask level in the manufacturing process. By creating a break (open circuit) in the conductors (which are metal lines) at the points 125 in lines 71, 118, 111, etc., the refresh counter is completely removed from the circuit with one small mask change, with no degradation in standard operation, yet the chip need not be redesigned.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A refresh address counter for a semiconductor dynamic memory device, said device having address enable inputs and having a plurality of address inputs Ao–An, comprising:
   a plurality of address input buffers, each receiving one of said address inputs in a first stage and producing high-level address signals (A, $\overline{A}$) from a second stage, the output of each such first stage being coupled to the input of each second stage by first transfer means,
   a plurality of counter stages, one for each of said address input buffers, an output of each counter stage being coupled to said input of the second stage of the corresponding address input buffer by second transfer means,
   each said counter stage including incrementing input means, said incrementing means having an input coupled by third transfer means to said output of said second stage of the corresponding input buffer,
   control means responsive to said address enable inputs and operative to activate said first transfer means, or in the alternative to activate said second transfer means then later to activate said third transfer means.

2. A device according to claim 1 wherein said enable inputs are row address strobe $\overline{RAS}$ and column address strobe $\overline{CAS}$.

3. A device according to claim 2 wherein said control means activates said first transfer means if $\overline{RAS}$ is activated before $\overline{CAS}$, or alternatively activates said second then third transfer means if $\overline{CAS}$ is activated before $\overline{RAS}$.

4. A device according to claim 1 wherein each or said address input buffers and counter stages are activated by a plurality of common clock voltages.

5. A device according to claim 4 wherein all of said address input buffers and all of said counter stages employ differential-input bistable circuits activated by said common clock voltages and having similar construction.

6. A device according to claim 5 wherein said enable inputs are row address strobe $\overline{RAS}$ and column address strobe $\overline{CAS}$.

7. A device according to claim 6 wherein said control means activates said first transfer means if $\overline{RAS}$ is activated before $\overline{CAS}$, or alternatively activates said second then third transfer means if $\overline{CAS}$ is activated before $\overline{RAS}$.

8. An address counter for a semiconductor memory device having address control inputs, and having a plurality of address inputs, comprising:
a plurality of address input buffer circuits, each buffer circuit receiving one of said address inputs in a first stage and producing high-level address output signals from a second stage, the output of each such first stage being coupled to the input of each second stage by first transfer means,
a plurality of address counter stages, one for each of said address input buffer circuits, an output of each counter stage being coupled to said input of the second stage of the corresponding address input buffer circuit by second transfer means,
each said counter stage including incrementing means,
control means responsive to said address control inputs and operative to activate said first transfer means, or in the alternative to activate said second transfer means.

9. A device according to claim 8 wherein said address control inputs are row address strobe $\overline{RAS}$ and column address strobe $\overline{CAS}$.

10. A device according to claim 9 wherein said control means activates said first transfer means if $\overline{RAS}$ is activated before $\overline{CAS}$, or alternatively activates said second transfer means if $\overline{CAS}$ is activated before $\overline{RAS}$.

11. A device according to claim 8 wherein each of said address input buffer circuits and counter stages are activated by common clock voltages.

12. A device according to claim 11 wherein each of said address input buffer circuits and counter stages employ differential-input bistable circuits of similar construction.

13. A device according to claim 12 wherein said address control inputs are row address strobe $\overline{RAS}$ and column address strobe $\overline{CAS}$.

14. A device according to claim 13 wherein said control means activates said first transfer means if $\overline{RAS}$ is activated before $\overline{CAS}$, or alternatively activates said second transfer means if $\overline{CAS}$ is activated before $\overline{RAS}$.

* * * * *

UNITED STATES PATENT AND TRADEMARK OFFICE
CERTIFICATE OF CORRECTION

PATENT NO. : B1 4,653,030
DATED : August 26, 1997
INVENTOR(S) : Tadashi Tachibana, Chitranjan N. Reddy, Ngai H. Hong It is certified that error appears in the above-indentified patent and that said Letters Patent is hereby corrected as shown below:

Column 1, line 51, change "producing a high-level address output signal" to --producing high-level address output signals--.

Column 1, lines 61-62, change "the high-level address output signal" to --one of the high level address output signals--.

Column 1, line 66, change "the high-level address output signal" to --said one of the high-level address output signals--.

Signed and Sealed this

Twenty-eighth Day of July, 1998

Attest:

BRUCE LEHMAN

*Attesting Officer*     *Commissioner of Patents and Trademarks*

REEXAMINATION CERTIFICATE (3302th)
United States Patent [19]
Tachibana et al.

[11] B1 4,653,030
[45] Certificate Issued Aug. 26, 1997

[54] SELF REFRESH CIRCUITRY FOR DYNAMIC MEMORY

[75] Inventors: Tadashi Tachibana, Miho, Japan; Chitranjan N. Reddy, Sugarland; Ngai H. Hong, Houston, both of Tex.

[73] Assignee: Texas Instruments Incorporated, Dallas, Tex.

Reexamination Request:
No. 90/004,405, Oct. 4, 1996

Reexamination Certificate for:
Patent No.: 4,653,030
Issued: Mar. 24, 1987
Appl. No.: 646,655
Filed: Aug. 31, 1984

[51] Int. Cl.⁶ .................................................. G11C 7/00
[52] U.S. Cl. ................................. 365/222; 365/189.05
[58] Field of Search ............................ 365/189.05, 222

[56] References Cited

U.S. PATENT DOCUMENTS 4,412,314  10/1983  Proebsting ................... 365/222

FOREIGN PATENT DOCUMENTS

0060108 A2  9/1982  European Pat. Off. .
2024474     1/1980  United Kingdom .

OTHER PUBLICATIONS

INMOS IMS2600 High Performance 64K Dynamic RAM, Oct. 1981.

*Primary Examiner*—Son Dinh

[57] ABSTRACT

A semiconductor dynamic read/write memory of the multiplexed-address type employs an on-chip refresh counter which is activated by $\overline{CAS}$-before-$\overline{RAS}$ sequence. This counter is made up of stages almost identical to the row address buffers so the same clocks can be used. Either the address input buffers or the refresh counter stages are gated into second-stage row address buffers, and carry feedback from these second stage buffers to the counter stages is used to increment the counter. The access time of the memory for normal read or write is not degraded by the refresh circuitry.

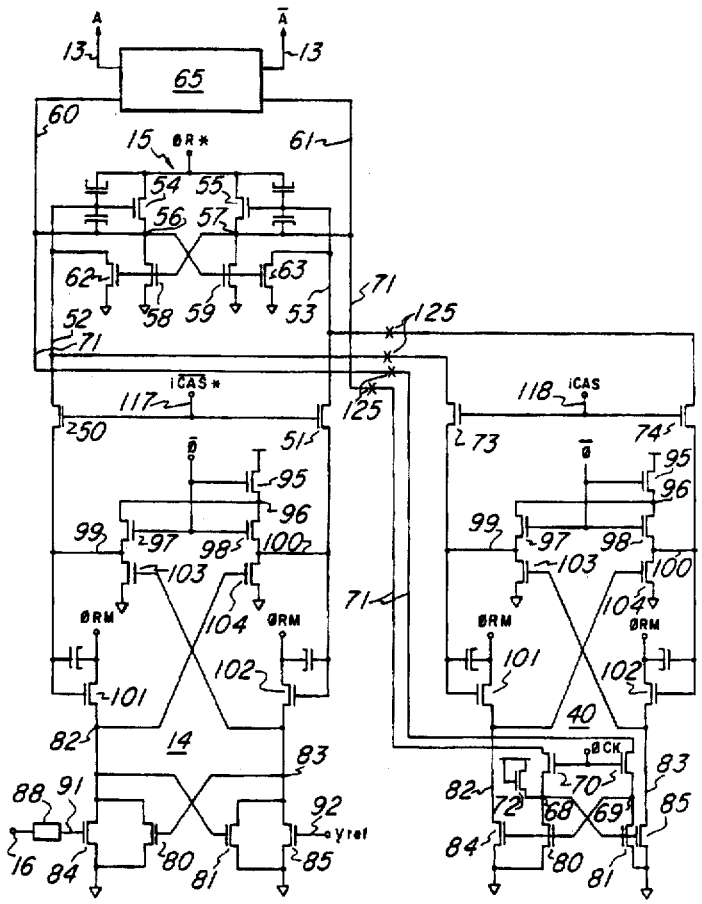

_B1 4,653,030_

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 8 are determined to be patentable as amended.

Claims 2–7 and 9–14, dependent on an amended claim, are determined to be patentable.

New claims 15–40 are added and determined to be patentable.

1. A refresh address counter for a semiconductor dynamic memory device, said device having address enable inputs and having a plurality of address inputs Ao-An, comprising:
   a plurality of address input buffers, each receiving one of said address inputs in a first stage and producing high-level address signals, (A,$\bar{A}$) from a second stage, the output of each such first stage being coupled to the input of each second stage by *a current path of* first transfer means,
   a plurality of counter stages, one for each of said address input buffers, an output of each counter stage being coupled to said input of the second stage of the corresponding address input buffer by second transfer means,
   each said counter stage including incrementing input means, said incrementing means having an input coupled by third transfer means to said output of said second stage of the corresponding input buffer,
   control means responsive to said address enable inputs and operative to activate said first transfer means, or in the alternative to activate said second transfer means then later to activate said third transfer means.

8. An address counter for a semiconductor memory device having address control inputs, and having a plurality of address inputs, comprising:
   a plurality of address input buffer circuits, each buffer circuit receiving one of said address inputs in a first stage and producing a high-level address output signal from a second stage, [the output] *a first output signal* of each such first stage being [coupled to the] *applied to a respective* input *terminal* of each second stage by a first transfer means,
   *each second stage including a first and a second transistor,*
   *the first transistor having a current path coupled to an output terminal of the second stage and having a gate for receiving the first output signal, the first transistor conducting to produce the high-level address output signal for a first state of the first output signal and not conducting for a second state of the first output signal,*
   *the second transistor having a current path for receiving the first output signal, the conductivity of the current path responsive to the high-level address output signal,*
   a plurality of address counter stages, one for each of said address input buffer circuits, [an output of each] *a second output signal of each* counter stage being [coupled] *applied* to said input *terminal* of the second stage of the corresponding address input buffer circuit by second transfer means,
   each said counter stage including incrementing means, *and*
   control means responsive to said address control inputs and operative to activate said first transfer means, or in the alternative to activate said second transfer means.

*15. A device according to claim 8 wherein said first stage further comprises:*
   *an input transistor having a gate and a current path, the gate receiving the one of said address inputs;*
   *a first drive transistor having a gate and a current path, the gate coupled to the current path of the input transistor; and*
   *a second drive transistor having a gate and a current path, the gate coupled to the current path of the first drive transistor, the current path coupled to the current path of the input transistor.*

*16. A device according to claim 15 wherein the current paths of the first and second drive transistors are coupled to a reference supply.*

*17. An address counter for a semiconductor memory device including a control circuit for receiving a plurality of address control signals and producing a select signal, the address counter having a plurality of buffers, each buffer comprising:*
   *a first stage for receiving an address input signal and producing a first output signal at a first stage output terminal;*
   *a second stage for receiving the first output signal at a second stage input terminal and producing a second output signal at a second stage output terminal, the second stage including a first and a second transistor,*
   *the first transistor having a current path coupled to the second stage output terminal and having a gate for receiving the first output signal, the first transistor conducting to produce the second output signal for a first state of the first output signal and not conducting for a second state of the first output signal,*
   *the second transistor having a current path for receiving the first output signal, the current path conducting, responsive to the second output signal;*
   *a first transfer transistor having a current path for coupling the first stage output terminal to the second stage input terminal, responsive to a first state of the select signal;*
   *a counter stage for storing an address bit at a counter output terminal, the counter stage complementing the address bit, in response to a clock signal; and*
   *a second transfer transistor having a current path for coupling the counter output terminal to the second stage input terminal, responsive to a second state of the select signal.*

*18. A device according to claim 17 wherein the address control signals are row address strobe RAS and column address strobe CAS.*

*19. A device according to claim 18 wherein the control circuit produces the first state of the select signal if RAS is activated before CAS and produces the second state of the select signal if CAS is activated before RAS.*

*20. A device according to claim 17 wherein the semiconductor memory device is a dynamic random access memory device.*

21. A device according to claim 20 wherein the second output signals from the plurality of buffers comprise a row address, the row address selecting at least one row of memory cells in the dynamic random access memory device.

22. A device according to claim 21 wherein said first stage further comprises:

an input transistor having a gate and a current path, the gate receiving the one of said address inputs;

a first drive transistor having a gate and a current path, the gate coupled to the current path of the input transistor; and a second drive transistor having a gate and a current path, the gate coupled to the current path of the first drive transistor, the current path coupled to the current path of the input transistor.

23. A device according to claim 22 wherein the second stage latches the second output signal at the second output terminal.

24. A device according to claim 23 wherein the first stage latches the first output signal at the first output terminal.

25. A device according to claim 20 wherein the control circuit produces the clock signal in response to the address control signals.

26. A device according to claim 25 wherein the address bit is complemented in response to the clock signal.

27. A device according to claim 25 wherein the address bit is complemented in response to the clock signal and at least one other address bit.

28. A device according to claim 27 further comprising a carry circuit, the carry circuit complementing the address bit in response to the clock signal and the at least one other address bit.

29. An address counter for a semiconductor memory device including a control circuit for receiving a plurality of address control signals and producing a select signal, the address counter having a plurality of buffers, each buffer comprising:

a first stage for receiving an address input signal and producing a first output signal at a first stage output terminal;

a second stage for receiving the first output signal at a second stage input terminal and producing a second output signal at a second stage output terminal, the second stage including a first and a second enhancement mode transistor, the first enhancement mode transistor having a current path coupled to the second stage output terminal and having a gate for receiving the first output signal, the first enhancement mode transistor in an on state for producing the second output signal, responsive to the first output signal, the second enhancement mode transistor having a current path for receiving the first output signal, the conducting state of the current path responsive to the second output signal;

a first transfer transistor having a current path for coupling the first stage output terminal to the second stage input terminal, responsive to a first state of the select signal;

a counter stage for storing an address bit at a counter output terminal, the counter stage complementing the address bit, in response to a clock signal; and a second transfer transistor having a current path for coupling the counter output terminal to the second stage input terminal, responsive to a second state of the select signal.

30. A device according to claim 29 wherein the address control signals are row address strobe RAS and column address strobe CAS.

31. A device according to claim 30 wherein the control circuit produces the first state of the select signal if RAS is activated before CAS and produces the second state of the select signal if CAS is activated before RAS.

32. A device according to claim 29 wherein the semiconductor memory device is a dynamic random access memory device.

33. A device according to claim 32 wherein the second output signals form the plurality of buffers comprise a row address, the row address selecting at least one row of memory cells in the dynamic random access memory device.

34. A device according to claim 33 wherein said first stage further comprises:

an input transistor having a gate and a current path, the gate receiving the one of said address inputs;

a first drive transistor having a gate and a current path, the gate coupled to the current path of the input transistor; and a second drive transistor having a gate and a current path, the gate coupled to the current path of the first drive transistor, the current path coupled to the current path of the input transistor.

35. A device according to claim 34 wherein the second stage latches the second output signal at the second output terminal.

36. A device according to claim 35 wherein the first stage latches the first output signal at the first output terminal.

37. A device according to claim 32 wherein the control circuit produces the clock signal in response to the address control signals.

38. A device according to claim 37 wherein the address bit is complemented in response to the clock signal.

39. A device according to claim 37 wherein the address bit is complemented in response to the clock signal and at least one other address bit.

40. A device according to claim 39 further comprising a carry circuit, the carry circuit complementing the address bit in response to the clock signal and the at least one other address bit.

* * * * *